(12) United States Patent
Leuschner et al.

(10) Patent No.: US 8,822,329 B2
(45) Date of Patent: Sep. 2, 2014

(54) METHOD FOR MAKING CONDUCTIVE INTERCONNECTS

(75) Inventors: Rainer Leuschner, Regensburg (DE); Gunther Mackh, Neumarkt (DE); Uwe Seidel, Munich (DE)

(73) Assignee: Infineon Technologies AG, Neubiberg (DE)

( * ) Notice: Subject to any disclaimer, the term of this patent is extended or adjusted under 35 U.S.C. 154(b) by 1312 days.

(21) Appl. No.: 12/567,950

(22) Filed: Sep. 28, 2009

(65) Prior Publication Data
US 2011/0073997 A1 Mar. 31, 2011

(51) Int. Cl.
 H01L 23/535 (2006.01)
 H01L 21/768 (2006.01)
 H01L 23/522 (2006.01)

(52) U.S. Cl.
 CPC ......... *H01L 21/7681* (2013.01); *H01L 23/5226* (2013.01); *H01L 21/76877* (2013.01); *H01L 21/76843* (2013.01); *H01L 21/76816* (2013.01); *H01L 21/76847* (2013.01); *H01L 21/76898* (2013.01)
 USPC ............................. 438/627; 438/643; 438/653

(58) Field of Classification Search
 USPC .................. 438/618–681, E21.597, E21.584
 See application file for complete search history.

(56) References Cited

U.S. PATENT DOCUMENTS

| | | | |
|---|---|---|---|
| 4,794,565 A | 12/1988 | Wu et al. | |
| 5,073,513 A | 12/1991 | Lee | |
| 6,291,297 B1 | 9/2001 | Chen | |
| 7,691,747 B2 * | 4/2010 | Lin et al. | 438/667 |
| 2002/0163072 A1 | 11/2002 | Gupta et al. | |
| 2005/0263891 A1 * | 12/2005 | Lee et al. | 257/751 |
| 2006/0166420 A1 | 7/2006 | Van Duuren et al. | |
| 2006/0244146 A1 * | 11/2006 | Colburn | 257/758 |
| 2007/0284729 A1 | 12/2007 | Kwon | |
| 2009/0102021 A1 * | 4/2009 | Chen et al. | 438/614 |
| 2009/0280643 A1 * | 11/2009 | Andry et al. | 438/656 |

FOREIGN PATENT DOCUMENTS

JP 2002190477 A 7/2002

* cited by examiner

*Primary Examiner* — Cuong Q Nguyen
(74) *Attorney, Agent, or Firm* — Infineon Technologies AG

(57) ABSTRACT

One or more embodiments relate to a method for making a semiconductor structure, the method including: forming a first conductive interconnect at least partially through the substrate; and forming a second conductive interconnect over the substrate, wherein the first conductive interconnect and the second conductive interconnect are formed at least partially simultaneously.

23 Claims, 8 Drawing Sheets

METHOD FOR MAKING CONDUCTIVE INTERCONNECTS

TECHNICAL FIELD

This invention relates generally to semiconductor structures, and more particularly to conductive interconnects formed in semiconductor structures.

BACKGROUND

One of the goals in the fabrication of electronic components is to minimize the size of various components. For example, it is desirable that hand held devices such as cellular telephones and personal digital assistants (PDAs) be as small as possible. To achieve this goal, the semiconductor circuits that are included within the devices should be as small as possible. One way of making these circuits smaller is to stack the chips that carry the circuits.

A number of ways of interconnecting the chips within the stack are known. For example, bond pads formed at the surface of each chip can be wire-bonded, either to a common substrate or to other chips in the stack. Another example is a so-called micro-bump 3D package, where each chip includes a number of micro-bumps that are routed to a circuit board, e.g., along an outer edge of the chip.

Yet another way of interconnecting chips within the stack is to use through-substrate vias. Through-substrate vias extend through the substrate and are thereby capable of electrically interconnecting circuits on various chips. Through-substrate via interconnections may provide advantages in terms of interconnect density compared to other technologies. In addition to applications in 3D chip stacking, through-substrate via interconnections may be used to increase performance of RF and power devices by providing very low resistive ground contacts to wafer backside and advanced heat sink capability. However, introduction of such interconnects may introduce additional challenges.

The integration of chips in 3D brings forth a number of new challenges that need to be addressed. Hence, what is needed in the art are improved structures and methods of making conductive interconnects such as through-substrate vias.

DETAILED DESCRIPTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

For through-substrate vias in semiconductor fabrication different fabrication schemes may be used. One option is the via first option which is to first etch the opening for the through-substrate via from the top of the wafer down, optionally insulate the opening, and then form a metallic material in the opening all before BEOL (back end of line) processing (before, for example, forming the metallization levels). The wafer backside is later ground and a backside contact is formed. Another option is the via from the backside option which is to first thin the wafer and then etch the opening for the through-silicon via from the backside of the wafer. The opening may then, optionally be insulated, and a metal may then be formed within the opening. A backside contact may then be formed. A possible advantage of the via first option may be to process more steps with thick silicon wafers while a possible advantage of the via from the backside option may be an easier integration into existing process flows.

Figure 1:
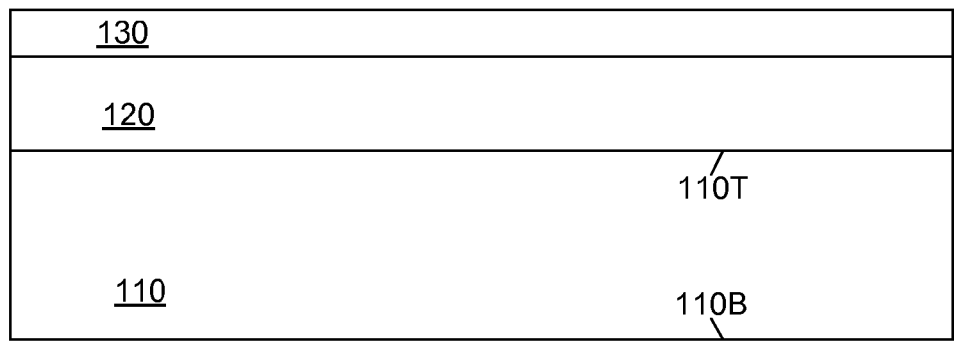
FIGS. 1 through 17 show methods of making semiconductor structures in accordance with embodiments of the present invention.

FIGS. 1 through 17 illustrate methods of making conductive interconnects in accordance with embodiments of the present invention. Referring to FIG. 1, a substrate 110 is provided. The substrate 110 may be any type of substrate. The substrate 110 comprises a top surface 110T and a bottom surface 110B. In one or more embodiments, the substrate 110 may be a semiconductor substrate. In one or more embodiments, the semiconductor substrate may be a silicon substrate (such as bulk silicon). In one or more embodiments, the semiconductor substrate may be a p-type substrate. In one or more embodiments, the semiconductor substrate may be a bulk mono-crystalline layer silicon substrate. In one or more embodiments, the semiconductor substrate may be a silicon-on-insulator (SOI) substrate. The SOI substrate may, for example, be formed by a SIMOX process. In one or more embodiments, the semiconductor substrate may be a silicon-on-sapphire (SOS) substrate or a germanium-on-insulator (GeOI) substrate. In one or more embodiments, the semiconductor substrate may include one or more semiconductor materials such as silicon, silicon germanium, germanium, germanium arsenide, indium arsenide, indium arsenide, indium gallium arsenide, or indium antimonide.

Still referring to FIG. 1, a first dielectric layer 120 may be formed over the substrate 110. Generally, the first dielectric layer 120 may comprise any dielectric material such as an oxide (such as silicon oxide), a nitride (such as silicon nitride), an oxynitride (such as silicon oxynitride), or mixtures thereof. In one or more embodiments, the first dielectric layer 120 may comprise an oxide (such as silicon oxide).

Still referring to FIG. 1, a second dielectric layer 130 may be formed over the first dielectric layer 120. Generally, the second dielectric layer 120 may comprise any dielectric material such as an oxide (such as silicon oxide), a nitride (such as silicon nitride), an oxynitride (such as silicon oxynitride), or mixtures thereof. In one or more embodiments, the second dielectric layer 130 may comprise a nitride (such as silicon nitride). In one or more embodiments, the second dielectric layer 130 may comprise a dielectric material which is different from that of the first dielectric layer 120.

Figure 2:
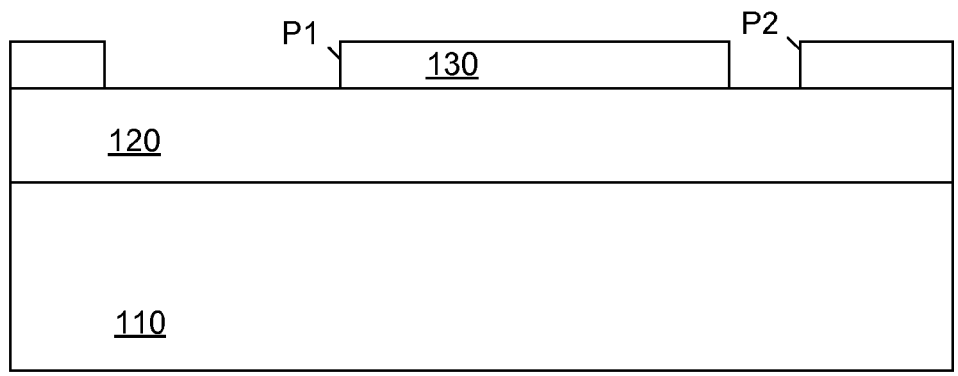

Referring to FIG. 2, an opening P1 and an opening P2 may be formed through the second dielectric 130. The openings P1 and P2 may be formed so that each of the openings P1 and P2 exposes the first dielectric layer 120. The openings P1 and P2 may be formed by using a photolithographic process as well as an etch process such as a dry etch process. The etch process used may be a reactive ion etch. The opening P1 may be a hole or a trench. The opening P2 may be a hole or a trench. In one or more embodiments, the openings P1 and P2 may be formed at least partially simultaneously.

When two or more events occur at least partially simultaneously there may be at least some overlap in time in the occurrence of all of the two or more events. In one or more embodiments, all of the events may at least partially overlap in time. In one or more embodiments, two or more events which occur at least partially simultaneously may include one or more common process steps. The common process steps may include, for example, etching process steps, deposition process steps, growth process steps, CMP process step, etc. In one or more embodiments, two or more events which occur at least partially simultaneously may all possibly (but need not) begin at substantially the same time. In one or more embodiments, two or more events which occur at least partially simultaneously may possibly (but need not) end at substantially the same time.

In one or more embodiments, the two openings P1, P2 may be formed at least partially simultaneously. In one or more embodiments, the formation of the two openings may involve at least one common process step such as a common etching step. In one or more embodiments, the two openings may be formed using a common etching step. In one or more embodiments, the two openings P1, P2 may be formed substantially simultaneously. In one or more embodiments, the formations of the two openings may begin at substantially the same time and end at substantially the same time.

Figure 3:
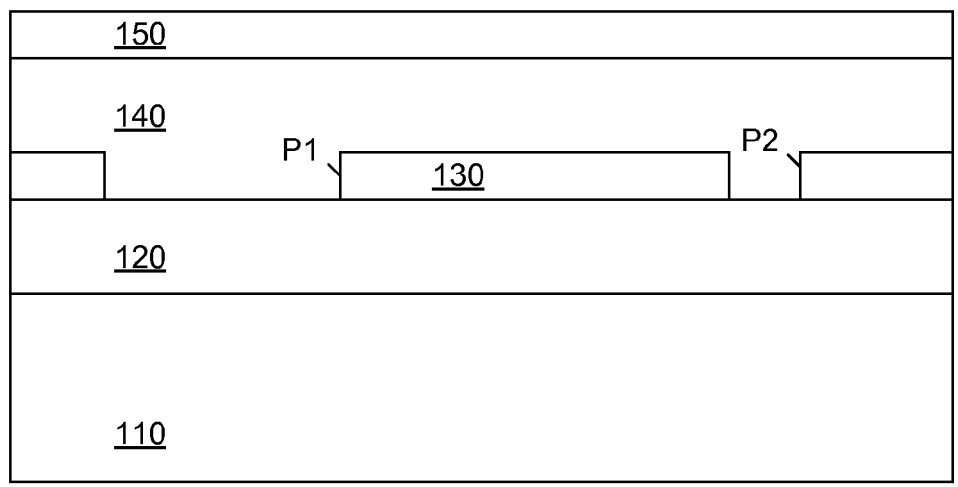

Referring to FIG. 3, a third dielectric layer 140 may be formed over the second dielectric layer 130. The third dielectric layer 140 is disposed within the openings P1 and P2. Generally, the third dielectric layer 130 may comprise any dielectric material such as an oxide (such as silicon nitride), a nitride (such as silicon nitride), an oxynitride (such as silicon oxynitride), or mixtures thereof. In one or more embodiments, the third dielectric layer 140 may comprise an oxide (such as silicon oxide). In one or more embodiments, the third dielectric layer 140 may comprise a dielectric material which is different from that of the second dielectric layer 130. In one or more embodiments, the third dielectric layer 140 may comprise a dielectric material which is the same as that of the first dielectric layer 120. In one or more embodiments, the first dielectric layer 120, the second dielectric layer 130 and the third dielectric layer 140 may each comprise a different dielectric material. Still referring to FIG. 3, a photoresist layer 150 may be formed over the third dielectric layer 140.

Figure 4:
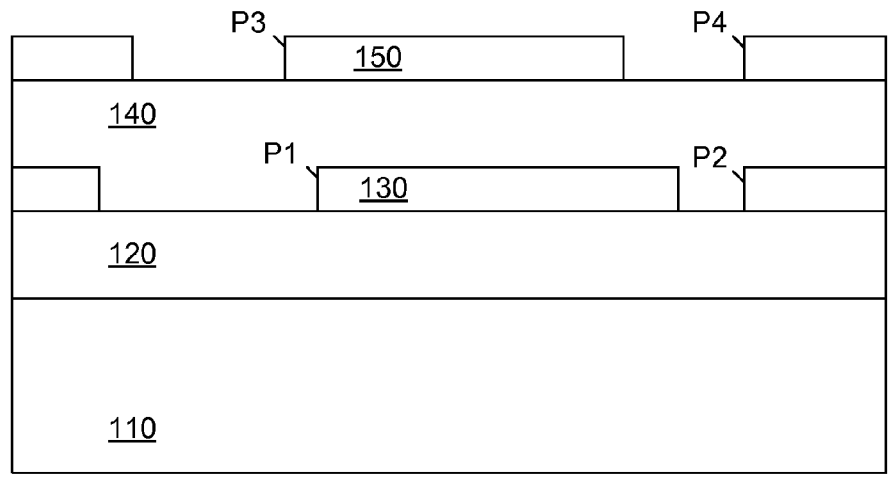

Referring to FIG. 4, the photoresist layer 150 may be patterned to form openings P3 and P4 through the photoresist layer 150. The openings P3 and P4 may be formed so as to expose the third dielectric layer 140. The opening P3 may be formed over the opening P1. In one or more embodiments, the opening P3 may have a lateral dimension smaller than that of the opening P1. In one or more embodiments, the opening P3 may have a lateral dimension larger than that of the opening P1. In one or more embodiments, the opening P3 may have substantially the same lateral dimension as that of the opening P1.

The opening P3 may be a hole or a trench. The opening P4 may be formed over the opening P2. In one or more embodiments, the opening P4 may have a lateral dimension larger than that of the opening P2. The opening P4 may be a hole or a trench. In one or more embodiments, the openings P3 and P4 may be formed at least partially simultaneously. In one or more embodiments, the openings P3 and P4 may be formed substantially simultaneously. In one or more embodiments, the opening P3 and P4 may be formed using a common etching step. In one or more embodiments, the formation of the openings P3, P4 may begin at substantially the same time and end at substantially the same time.

Figure 5:
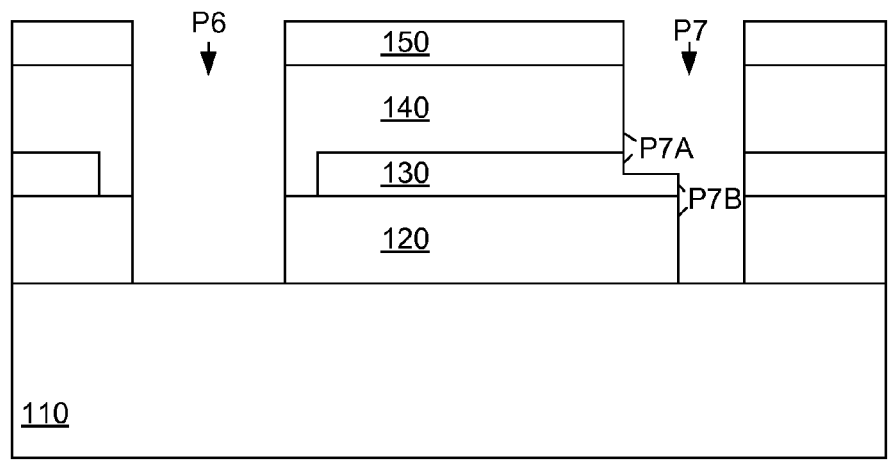

Referring to FIG. 5, the third dielectric layer 140 and the first dielectric layer 120 may then be etched using the photoresist layer 150 as a mask to form the opening P6 and P7. The openings P6 and P7 may both be formed through the third dielectric layer 140 and the first dielectric layer 120. Each of the openings P6 and P7 may be formed so as to expose the substrate 110. The opening P6 may be a hole or a trench.

In one or more embodiments, the openings P6 and P7 both be formed using the same masking step. In one or more embodiments, the formation of the openings P6 and P7 may comprise at least one common process step such as a common etching step. In one or more embodiments, the openings P6 and P7 may be formed in a common etching step. In one or more embodiments, the openings P6 and P7 may be formed at least partially simultaneously. In one or more embodiments, the formation of the openings P6 and P7 may begin and end at substantially the same time. In one or more embodiments, the openings P6 and P7 may be formed at substantially simultaneously.

The opening P7 may include a first portion P7A formed through an upper portion of the dielectric layer comprising the first dielectric layer 120, the second dielectric layer 130, and the third dielectric layer 140. The opening P7 may include a second portion P7B formed through a lower portion of the dielectric layer comprising the first dielectric layer 120, the second dielectric layer 130, and the third dielectric layer 140. A dielectric layer may comprise, for example, a stack of two or more dielectric layers (e.g. sub-layers). For example, the collection of dielectric layers 120, 130, 140 may itself be referred to as a dielectric layer.

Referring to FIG. 5, in one or more embodiments, the opening P7 may include a first portion P7A formed through the third dielectric layer 140 and an upper portion of the second dielectric layer 130. The opening P7 may include a second portion P7B formed through a lower portion of the second dielectric layer 130 and the first dielectric layer 120. Referring to FIG. 5, it is seen that the formation of the opening P7 may consume a portion of the second dielectric layer 130. In one or more embodiments, it is possible that substantially none of the second dielectric layer 130 may be consumed.

In one or more embodiments, the first portion P7A may have a lateral dimension which is larger than that of the second portion P7B (for example, the first portion P7A may be wider than the second portion P7B). The first portion P7A may be an upper portion of opening P7 and may be referred to as upper portion P7A. The second portion P7B may be a lower portion of opening P7 and may be referred to as lower portion P7B. The first (for example, upper) portion P7A of opening P7 may itself be viewed as an opening and may be referred to as opening P7A. Likewise, the second (for example, lower) portion P7B of opening P7 may itself be viewed as an opening and may be referred to as opening P7B.

The upper portion P7A of opening P7 may be a trench or a hole. In one or more embodiments, the upper portion P7A may be a trench. As discussed below, the upper portion P7A may be useful for the formation of a conductive line of a metallization level (such as the first metallization level).

The lower portion P7B of opening P7 may be a hole or a trench. In one or more embodiments, the lower portion P7B may be a hole. The lower portion P7B may be useful for the formation of a conductive contact. The conductive contact may be electrical coupled between a conductive line in the first metallization level and the substrate 110. In one or more embodiments, the conductive contact may electrically couple a conductive line in the first metallization level to the substrate 110.

In one or more embodiments, the formation of opening P7 may be as part of a dual damascene process. In one or more embodiments, the dual damascene process may comprise forming the opening P7A before forming the opening P7B. In one or more embodiments, the opening P7A and the opening P7B may be a formed in a common etch step.

The etch used to form the openings P6 and P7 may be a dry etch such as a dry plasma etch. The etch used may be a reactive ion etch (RIE). In one or more embodiments, the etch used to form the openings P6 and P7 may be selective to the first and third dielectric layers 120, 140 relative to the second dielectric layer 130. In the embodiment shown in FIG. 5, the etch through the third dielectric layer 140 and the first dielectric layer 120 may not substantially penetrate the second dielectric layer 130. In one or more embodiments, the first and third dielectric layers 120, 140 may be an oxide (such as a silicon oxide) while the second dielectric layer 130 may be a nitride (such as a silicon nitride). In this case, the etch may be selective to the oxide relative to the nitride. In another embodiment, the first and third dielectric layers 120, 140 maybe a nitride (such as a silicon nitride) while the second dielectric layer 130 may be an oxide (such as a silicon oxide). In this case, the etch may be selective to the nitride relative to the oxide. In one or more embodiments, the first and third dielectric layer 120, 140 may comprise a first dielectric while the second dielectric layer 130 may comprise a second dielectric.

In one or more embodiments, the openings P6 and P7A may both be formed using the same masking step. In one or more embodiments, the formation of the openings P6 and P7A may comprise at least one common process step such as a common etching step. In one or more embodiments, the openings P6 and P7A may be formed in a common etching step. In one or more embodiments, the openings P6 and P7A may be formed at least partially simultaneously. In one or more embodiments, the formation of the openings P6 and P7A may begin and end at substantially the same time. In one or more embodiments, the openings P6 and P7A may be formed at substantially simultaneously.

In one or more embodiments, the openings P6 and P7B may both be formed using the same masking step. In one or more embodiments, the formation of the openings P6 and P7B may comprise at least one common process step such as a common etching step. In one or more embodiments, the openings P6 and P7B may be formed in a common etching step. In one or more embodiments, the openings P6 and P7B may be formed at least partially simultaneously. In one or more embodiments, the formation of the openings P6 and P7B may begin and end at substantially the same time. In one or more embodiments, the openings P6 and P7B may be formed at substantially simultaneously.

Figure 6:
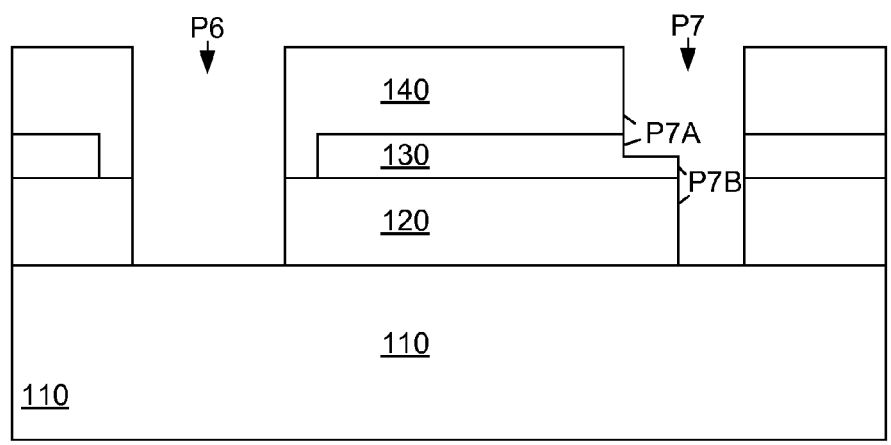

Referring to FIG. 6, the photoresist layer 150 may then be removed.

At this point in the process, at least two possible paths may be followed. One embodiment follows the process flow depicted by the process steps shown in FIGS. 7A, 8A and 9A. Another embodiment follows the process flow depicted by the process steps shown in FIGS. 7B, 8B and 9B.

Figure 7A:
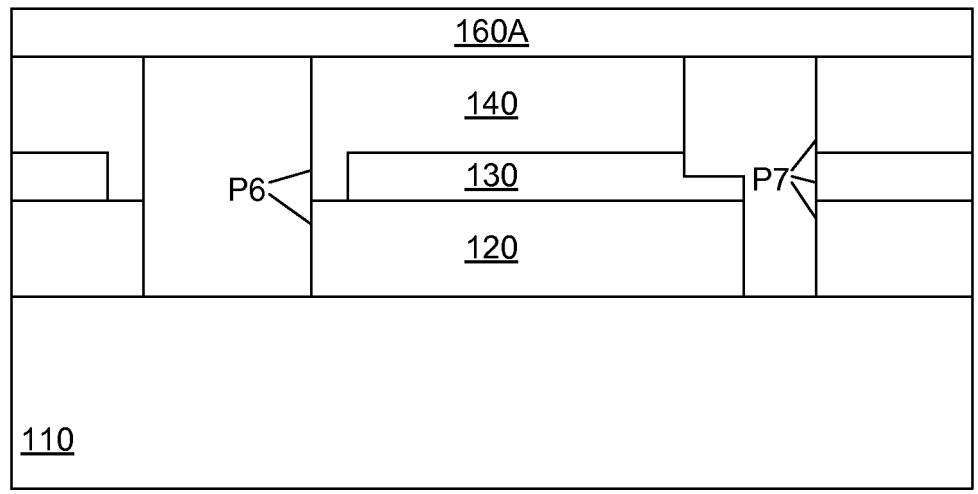

The process flow depicted by the process steps shown in FIGS. 7A, 8A and 9A will first be explained. Referring to FIG. 7A, a photoresist layer 160A may be applied to the structure shown in FIG. 6 to form the structure shown in FIG. 7A. In the embodiment shown in FIG. 7A, the photoresist layer 160A may be in the form of a foil and may be referred to as a photoresist foil. In one or more embodiments, the photoresist layer 160A may be a dry film photoresist. The photoresist layer 160A may be formed so as to overlie the opening P6 as well as the opening P7. In one or more embodiments, substantially none of the photoresist layer 160A penetrates the opening P6 or the opening P7. Hence, the photoresist layer 160A may simply span or bridge the openings P6 and P7 without substantially penetrating the openings. In other embodiments, the photoresist layer 160A may be replaced with any other photoresist material which may span or bridge the openings P6 and P7 without substantially penetrating the openings.

Figure 8A:
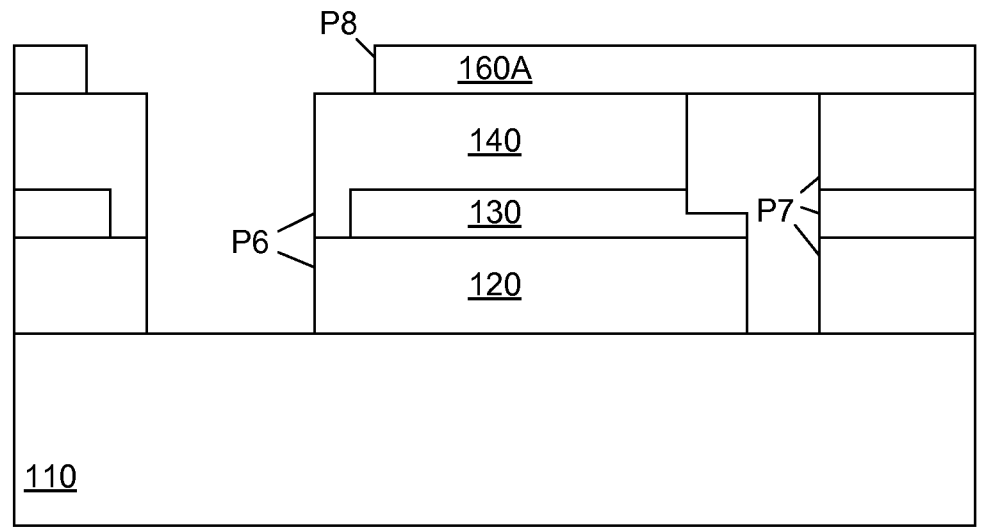

Referring to FIG. 8A, the photoresist layer 160A (as shown in FIG. 7A) may then be patterned to form the structure shown in FIG. 8A. As shown in FIG. 8A, an opening P8 may be formed through the photoresist layer 160A. In an embodiment, the opening P8 may be formed so as to overlie the opening P6. In the embodiment shown, the opening P8 overlies all of the opening P6 and, in addition, the lateral dimension (e.g. width) of the opening P8 may be about the same as or greater than that of the opening P6. In another embodiment, the opening P6 may be formed so as to overlie only a portion of the opening P6.

Figure 9A:
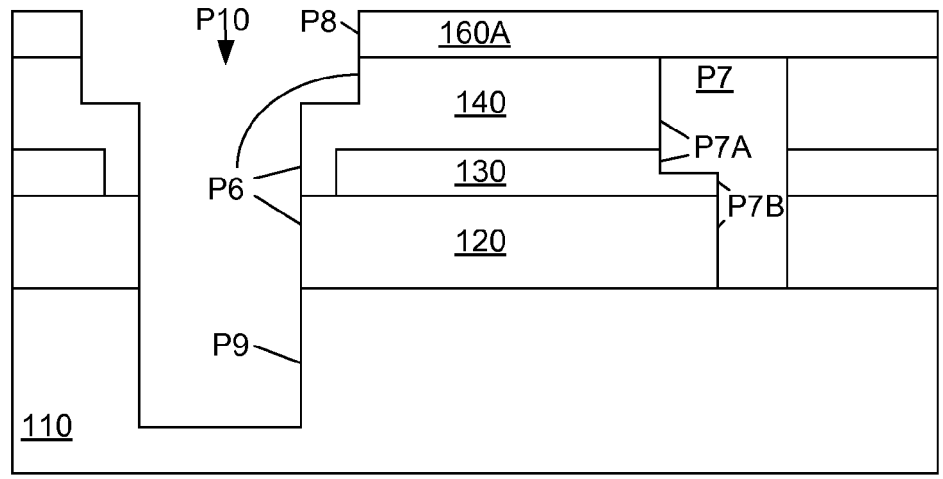

Referring to FIG. 9A, using the photoresist layer 160A and, optionally, the third dielectric layer 140 and/or the first dielectric layer 120 and/or the second dielectric layer 130 as masking layers, an opening P9 may be formed in the substrate 110. In the embodiment shown, the opening P9 may be formed only partially through the substrate 110. In another embodiment, it is conceivable that the opening P9 may instead go all the way through the substrate 110.

The opening P9 formed in the substrate 110 may be formed using an etching process (such as a dry plasma process). In one or more embodiments, the etch may be a reactive ion etch process. The etch used may be one which is selective to the substrate 110 relative to the first dielectric layer 120 and third dielectric layer 140 (and, optionally, selective also to the second dielectric layer 130). For example, in one or more embodiments, the first and third dielectric layers 120, 140 may comprise an oxide. The etch used may be selective to silicon relative to oxide. In another embodiment, the first and third dielectric layers 120, 140 may comprise a nitride. The etch used may be selective to silicon relative to nitride. It is possible (as shown in the embodiment of FIG. 9A) that the etch process may still etch also an upper portion of the third dielectric layer 140 so as to widen an upper portion of the opening P6.

Referring to FIG. 9A, after the opening P9 in the substrate 110 is complete, an opening P10 exists that goes through the first and third dielectric layers 120, 140 as well as within the substrate 110. The opening P10 includes the portion P6 through the dielectric layers 140, 120 as well as the portion P9 extending through at least a portion of the substrate 110. As noted, referring to FIG. 9A, it is seen that it is possible that a small amount of the third dielectric layer 140 may also be etched while the substrate 110 is being etched.

Figure 10:
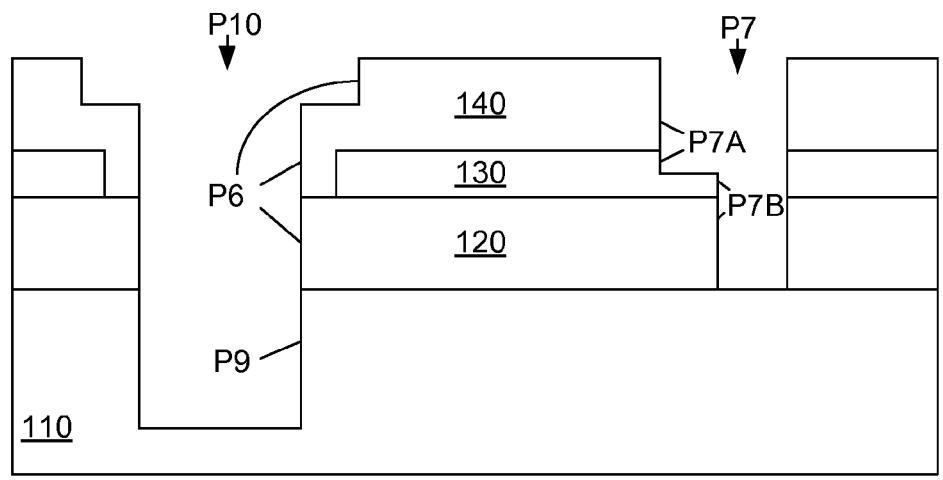

Referring to FIG. 10, after the formation of the opening P10, the photoresist layer 160A may be removed from the structure of FIG. 9A to form the structure shown in FIG. 10.

Figure 7B:
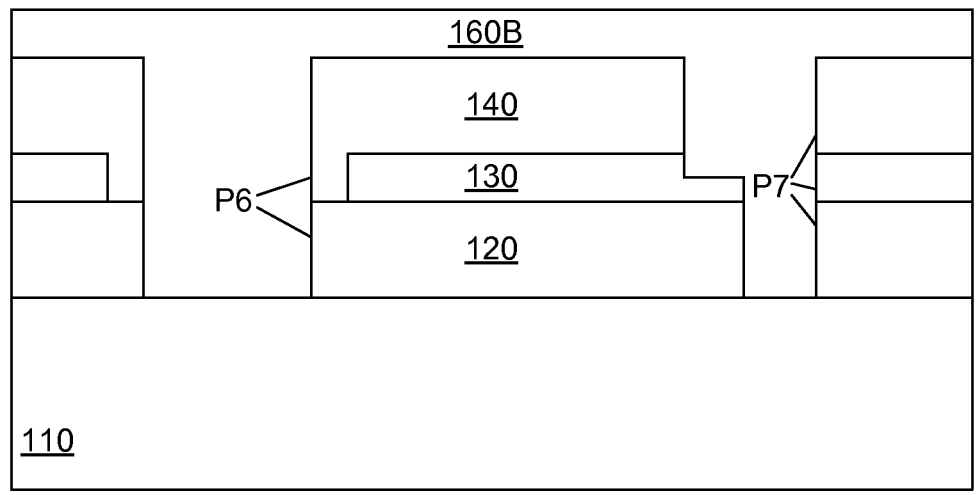
Figure 8B:
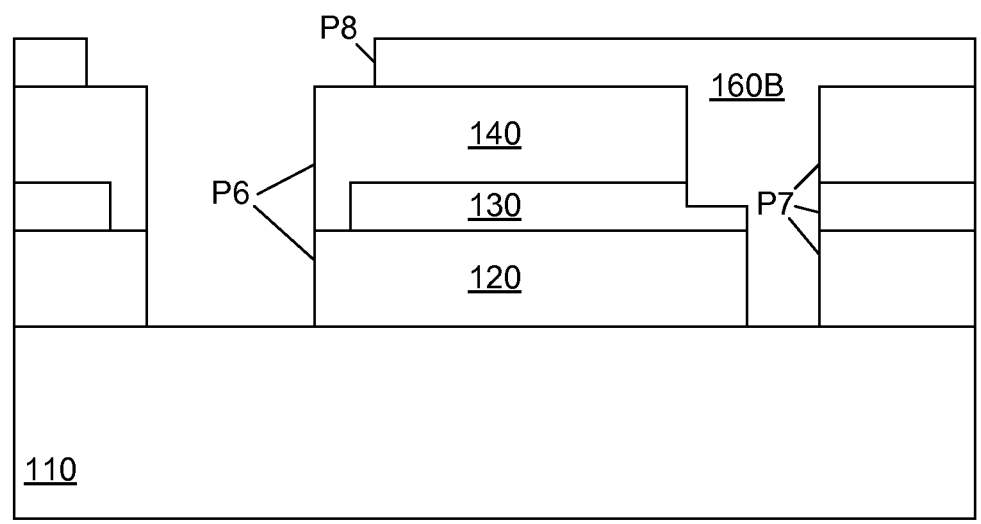
Figure 9B:
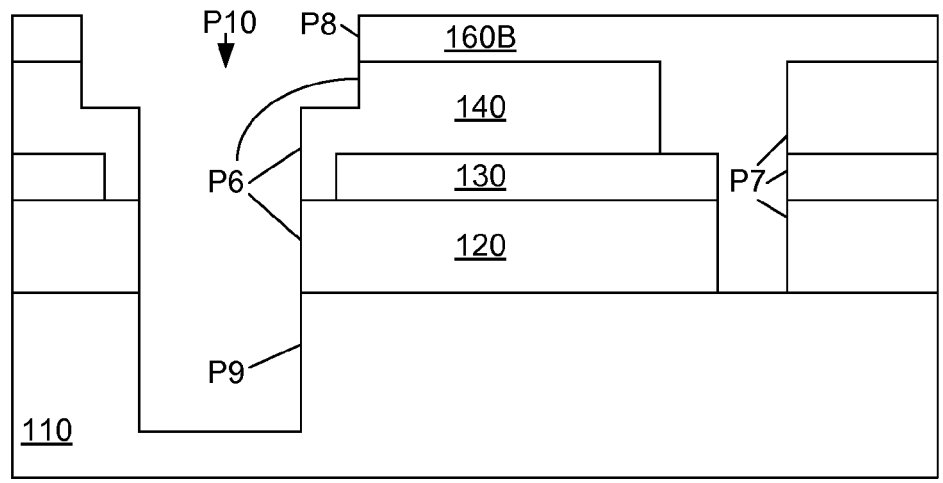

As discussed above, in another embodiment of the invention, the process steps shown in FIGS. 7B, 8B and 9B may be used instead of the process steps shown in FIGS. 7A, 8A and 9A. Referring to FIG. 7B, a photoresist layer 160B is formed over the structure shown in FIG. 6. The photoresist layer 160B may be formed so that it is formed within the opening P6 as well as the opening P7. In one or more embodiments, the photoresist layer 160B may at least partially fill each of the opening P6 and opening P7. In one or more embodiments, the photoresist layer 160B may substantially fill each of the opening P6 and opening P7. In one or more embodiments, the photoresist layer 160B may comprise or consist essentially of a wet photoresist.

Referring to FIG. 8B, the photoresist layer 160B (as shown in FIG. 7B) may then be patterned to form the structure shown in FIG. 8B. As shown in FIG. 8B, an opening P8 is formed in the photoresist layer 160B. In addition, the photoresist layer 160B may be removed from at least a portion of the opening P6. In one or more embodiments, the opening P8 may be formed so as to overlie the opening P6. In the embodiment shown, the opening P8 may overlie all of the opening P6. For example, the lateral dimension (e.g. width) of the opening P8 may be about the same as or larger than the width of the opening P6. In one or more embodiments, the opening P8 may overlie a portion of the opening P6.

Referring to FIG. 9B, using the photoresist layer 160B as a masking layer, an opening P9 may be formed at least partially through the substrate 110. In the embodiment shown, the opening P9 is formed only partially through the substrate 110. In another embodiment, it is conceivable that the opening P9 may instead go all the way through the substrate 110. In one or more embodiments, one or more of the layers 120, 130, 140 may also be used as masking layers when forming the opening P9.

Referring to FIG. 9B, the opening P9 may be formed using an etching process such as a dry etching process. In one or more embodiments, the etching process may be a plasma process. The etching process may be a reactive ion etching process. The etch may be selective to the substrate 110 relative to the material of the first and third dielectric layers 120, 140. For example, when the substrate 110 is formed of silicon and both the first and third dielectric layers 120, 140 are formed of an oxide, the etching process may be an etching process which is selective to silicon over oxide. For example, when the substrate 110 is formed of silicon and both the first and third dielectric layers 120, 140 are formed of a nitride, the etching process may be an etching process which is selective to silicon over the oxide. It is possible that the same etch process may also etch at least a portion of the third dielectric layer 140.

After the silicon etching process is complete an opening P10 exists which goes through the first and third dielectric elements 120, 140 as well as through at least a portion of the substrate 110. The opening P10 includes the portion P6 through the dielectric layers 140, 120 as well as the portion P9 extending through at least a portion of the substrate 110.

Referring to FIG. 10, after the formation of the opening P10, the photoresist layer 160B (as shown in FIG. 9B) may be removed to form the structure shown in FIG. 10. Substantially all of the photoresist 160B may be removed from the opening P7.

Figure 12:
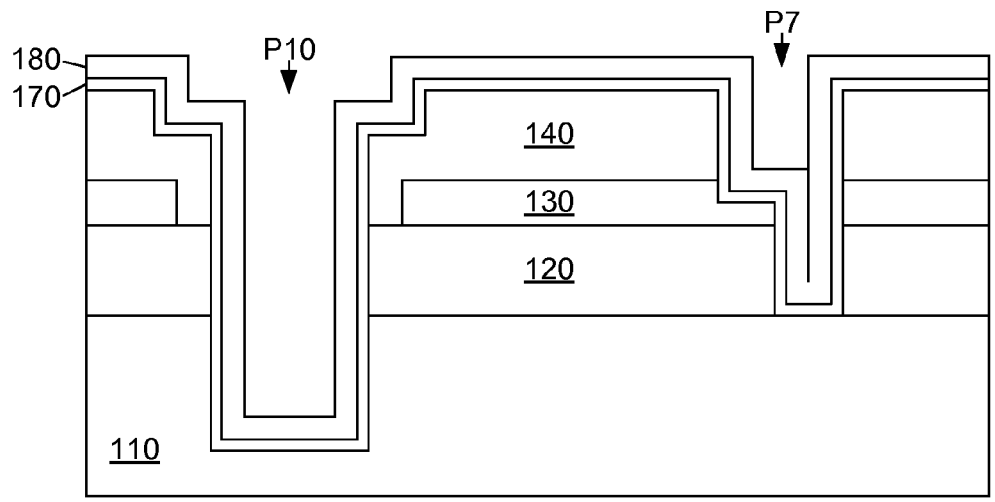

Referring to FIG. 12, a first barrier layer 170 may be formed within the opening P10 as well as within the opening P7. The first barrier layer 170 may be formed using a deposition process or by a growth process. The deposition process may, for example, be a substantially conformal deposition process. The first barrier layer 170 may be disposed over the sidewall and bottom surfaces of the opening P10 as well as the sidewall and bottom surfaces of the opening P7.

In one or more embodiments, the first barrier layer 170 may be formed at least partially simultaneously within the opening P7 and the opening P10. In one or more embodiments, the first barrier layer 170 may be formed substantially simultaneously within the opening P7 and the opening P10. In one or more embodiments, the formation of the first barrier layer 170 within the opening P7 and the opening P10 may comprise at least one common process step such as a common deposition step. In one or more embodiments, the first barrier layer 170 may be formed within the opening P7 and the opening P10 by a common deposition step. In one or more embodiments, the formation of the first barrier layer 170 within the opening P7 and the opening P10 may begin at substantially the same time and end at substantially the same time.

Still referring to FIG. 12, after the formation of the first barrier layer 170, a first conductive layer 180 may be formed over the first barrier layer 170 within the openings P10 and P7. The first conductive layer 180 may be formed by a growth process or by a deposition process. The deposition process may, for example, be a substantially conformal deposition process. In one or more embodiments, the first conductive layer 180 may at least partially fill the lower portion P7B of opening P7. In one or more embodiments, the first conductive layer 180 may substantially fill the lower portion P7B. In one or more embodiments, the first conductive layer 180 may at least partially fill the upper portion P7A of opening P7. Embodiments of the upper portion P7A and the lower portion P7B are shown in FIG. 6 as well as in other figures.

In one or more embodiments, the first conductive layer 180 may be formed at least partially simultaneously within the upper portion P7A and the lower portion P7B of opening P7. In one or more embodiments, the first conductive layer 180 may be formed substantially simultaneously within the upper portion P7A and the lower portion P7B. In one or more embodiments, the formation of the first conductive layer 180 within the upper portion P7A and the lower portion P7B may comprise at least one common process step such as a common deposition step. In one or more embodiments, the first conductive layer 180 may be formed within the upper portion P7A and the lower portion P7B by a common deposition step. In one or more embodiments, the formation of the first conductive layer 180 within the upper portion P7A and the lower portion P7B may begin at substantially the same time and end at substantially the same time.

In one or more embodiments, the first conductive layer 180 may be formed at least partially simultaneously within the opening P7 and the opening P10. In one or more embodiments, the first conductive layer 180 may be formed substantially simultaneously within the opening P7 and the opening P10. In one or more embodiments, the formation of the first conductive layer 180 within the opening P7 and the opening P10 may comprise at least one common process step such as a common deposition step. In one or more embodiments, the first conductive layer 180 may be formed within the opening P7 and the opening P10 by a common deposition step. In one or more embodiments, the formation of the first conductive layer 180 within the opening P7 and the opening P10 may begin at substantially the same time and end at substantially the same time.

In one or more embodiments, the first conductive layer 180 may be formed at least partially simultaneously within upper portion P7A of opening P7, within lower portion P7B of opening P10 and within the opening P10. In one or more embodiments, the first conductive layer 180 may be formed substantially simultaneously within upper portion P7A, within lower portion P7B and within the opening P10. In one or more embodiments, the formation of the first conductive layer 180 within the upper portion P7A, the lower portion P7B and the opening P10 may comprise at least one common process step such as a common deposition step. In one or more embodiments, the first conductive layer 180 may be formed within the upper portion P7A, the lower portion P7B and within the opening P10 by a common deposition step. In one or more embodiments, the formation of the first conductive layer 180 within the upper portion P7A, the lower portion P7B and the opening P10 may begin at substantially the same time and end at substantially the same time.

Figure 13:
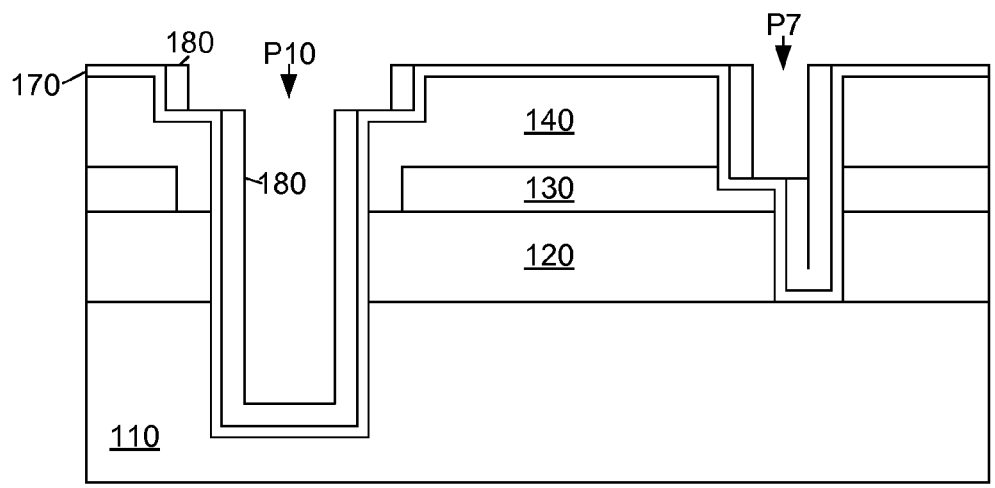

Referring to FIG. 13, after the formation of the first conductive layer 180, the structure shown in FIG. 11 may be processed to remove portions of the first conductive layer 180 that are on horizontally disposed surfaces by be removed. In one embodiment, this may be done by a chemical mechanical polishing (CMP) process. In another embodiment, an etch-back process may be used to remove the portions of the first conductive layer 180 that are on horizontally disposed surfaces.

Figure 14:
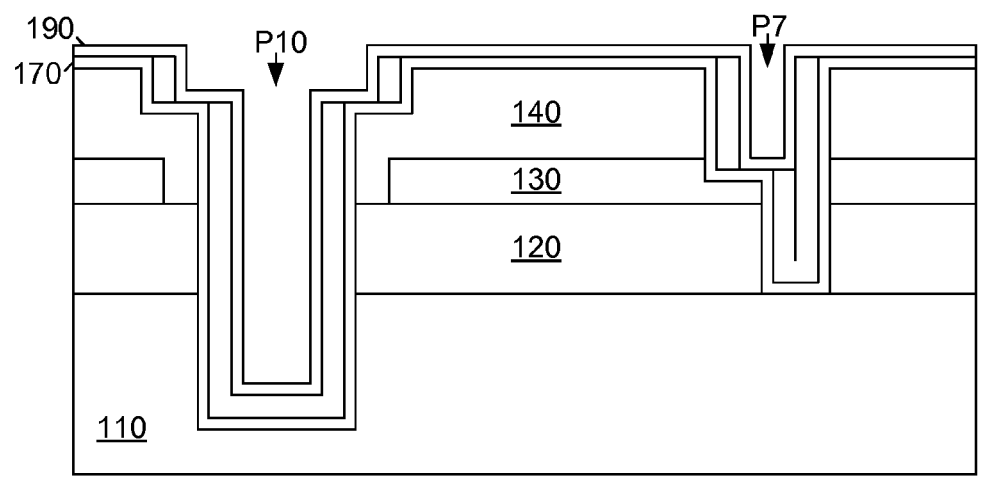

Referring to FIG. 14, after the removal of the portions of the first conductive layer 180 that are on horizontally disposed surfaces, a second barrier layer 190 may be formed over the structure of FIG. 13 to form the structure of FIG. 14. The second barrier layer 190 may be formed over the first conductive layer 180 within the openings P10 and P7. The second barrier layer 190 may be formed by a deposition process such as a substantially conformal deposition process.

In one or more embodiments, the second barrier layer 190 may be formed at least partially simultaneously within the opening P7 and the opening P10. In one or more embodiments, the second barrier layer 190 may be formed substantially simultaneously within the opening P7 and the opening P10. In one or more embodiments, the formation of the second barrier layer 190 within the opening P7 and the opening P10 may comprise at least one common process step such as a common deposition step. In one or more embodiments, the second barrier layer 190 may be formed within the opening P7 and the opening P10 by a common deposition step. In one or more embodiments, the formation of the second barrier layer 190 within the opening P7 and the opening P10 may begin at substantially the same time and end at substantially the same time.

Figure 15:
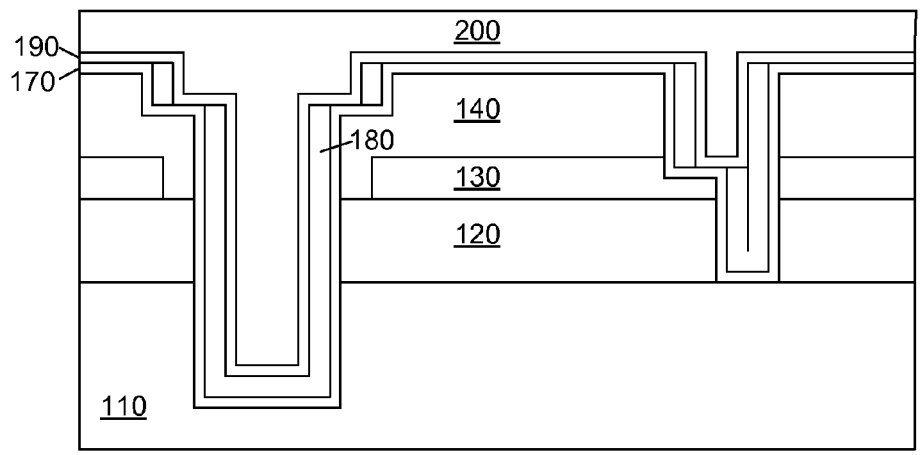

Referring to FIG. 15, after the formation of the second barrier layer 190, a second conductive layer 200 may be formed over the structure shown in FIG. 14, to form the structure shown in FIG. 15. The second conductive layer 200 may be formed over the first conductive layer within the openings P10 and P7 (where the openings P10 and P7 are shown in FIG. 10). The second conductive layer 200 may substantially fill the remainder of the openings P10 and P7. The second conductive layer 200 may, for example, be formed using an electrodeposition process.

In the embodiment shown in FIG. 15, the second conductive layer 200 is disposed in the upper portion P7A of the opening P7. However, in other embodiments, the second conductive layer 200 may also be formed in the lower portion P7B of the opening P7. For example, in one or more embodiments, the first conductive layer 180 may not completely fill the lower portion P7B. For example, the lateral width of the lower portion P7B may be such that there is still a space between the two portions of the first conductive layer 180 overlying the sidewalls of the lower portion P7B. This space may then be at least partially filled with the second conductive layer 200.

In one or more embodiments, the second conductive layer 200 may be formed at least partially simultaneously within the upper portion P7A and the lower portion P7B of opening P7. In one or more embodiments, the second conductive layer 200 may be formed substantially simultaneously within the upper portion P7A and the lower portion P7B. In one or more embodiments, the formation of the second conductive layer 200 within the upper portion P7A and the lower portion P7B may comprise at least one common process step such as a common deposition step. In one or more embodiments, the second conductive layer 200 may be formed within the upper portion P7A and the lower portion P7B by a common deposition step. In one or more embodiments, the formation of the second conductive layer 200 within the upper portion P7A and lower portion P7B may begin at substantially the same time and end at substantially the same time.

In one or more embodiments, the second conductive layer 200 may be formed at least partially simultaneously within the opening P7 and the opening P10. In one or more embodiments, the second conductive layer 200 may be formed substantially simultaneously within the opening P7 and the opening P10. In one or more embodiments, the formation of the second conductive layer 200 within the opening P7 and the opening P10 may comprise at least one common process step such as a common deposition step. In one or more embodiments, the second conductive layer 200 may be formed within the opening P7 and the opening P10 by a common deposition step. In one or more embodiments, the formation of the second conductive layer 200 within the opening P7 and the opening P10 may begin at substantially the same time and end at substantially the same time.

In one or more embodiments, the second conductive layer 200 may be formed at least partially simultaneously within the upper portion P7A and the opening P10. In one or more embodiments, the second conductive layer 200 may be formed substantially simultaneously within the upper portion P7A and the opening P10. In one or more embodiments, the formation of the second conductive layer 200 within the opening P7 and the opening P10 may comprise at least one common process step such as a common deposition step. In one or more embodiments, the second conductive layer 200 may be formed within the upper portion P7A and the opening P10 by a common deposition step. In one or more embodiments, the formation of the second conductive layer 200 within the upper portion P7A and the opening P10 may begin at substantially the same time and end at substantially the same time.

In one or more embodiments, the second conductive layer 200 may be formed at least partially simultaneously within upper portion P7A of opening P7, within the lower portion P7B of opening P7 and within the opening P10. In one or more embodiments, the second conductive layer 200 may be formed substantially simultaneously within the upper portion P7A, within the lower portion P7B and within the opening P10. In one or more embodiments, the formation of the second conductive layer 200 within the upper portion P7A, the lower portion P7B and the opening P10 may comprise at least one common process step such as a common deposition step. In one or more embodiments, the second conductive layer 200 may be formed within the upper portion P7A, the lower portion P7B and within the opening P10 by a common deposition step. In one or more embodiments, the formation of the second conductive layer 200 within the upper portion P7A, the lower portion P7B and the opening P10 may begin at substantially the same time and end at substantially the same time.

Figure 16:
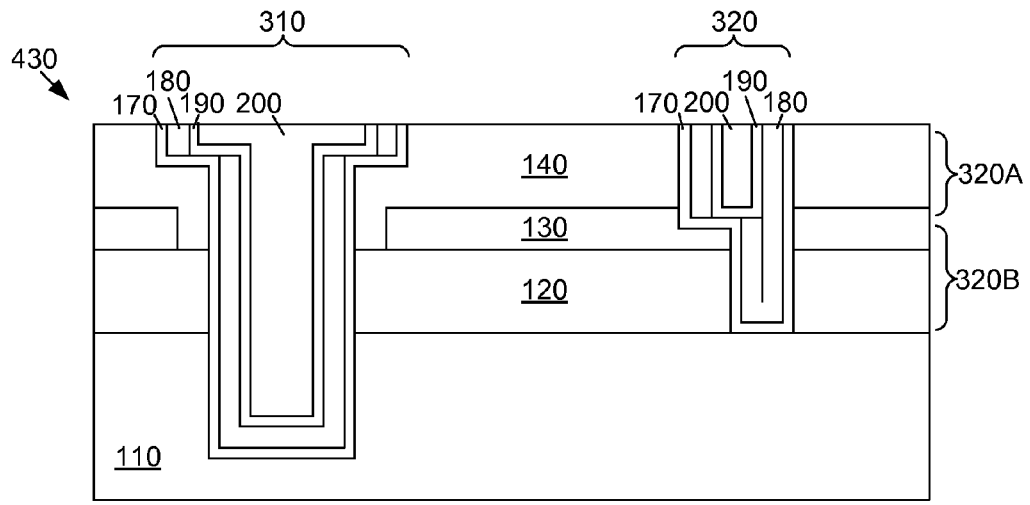

Referring to FIG. 16, the structure shown in FIG. 15 may then be subjected to a chemical mechanical polishing (CMP) process to form the structure shown in FIG. 16. The chemical mechanical polishing process may remove portions of the first barrier layer 170, the first conductive layer 180, the second barrier layer 190, and the second conductive layer 200. In other embodiments, portions of the first barrier layer 170, the first conductive layer 180, the second barrier layer 190, and the second conductive layer 200 may be removed by other means.

In one or more embodiments, the first and/or the second barrier layers 170, 190 may comprise at least one conductive material. In one or more embodiments, the conductive material may comprise a metallic material. In one or more embodiments, the metallic material may comprise a pure metal or a metal alloy. In one or more embodiments, the conductive material may be selected from the group consisting of Ti, TiN, Ta, TaN, and combinations thereof. In one or more embodiments, the barrier layer may comprise a Ti/TiN layer or a Ta/TaN layer.

In one or more embodiments, the first conductive layer 180 may comprise a metallic material. The metallic material may comprise a pure metal and/or a metal alloy. The first conductive layer 180 may, for example, comprise copper (Cu), gold (Au), silver (Ag), tungsten (W), and aluminum (Al). Examples of materials include pure copper, copper alloy, pure gold, gold alloy, pure silver, silver alloy, pure tungsten, tungsten alloy, pure aluminum, and aluminum alloy. It is, of course, understood that any pure metal may include some impurities.

In one or more embodiments, the second conductive layer 180 may comprise a metallic material. The metallic material may include a pure metal and/or a metal alloy. The first conductive layer 180 may, for example, comprise copper (Cu), gold (Au), silver (Ag), tungsten (W), and aluminum (Al). Examples of materials include pure copper, copper alloy, pure gold, gold alloy, pure silver, silver alloy, pure tungsten, tungsten alloy, pure aluminum, and aluminum alloy.

In one or more embodiments, the first conductive layer 180 may comprise a different material as the second conductive layer. In one or more embodiments, the first conductive layer 180 may comprise the same material as the second conductive layer.

Referring to FIG. 16, it is seen that two separate conductive interconnects 310 and 320 have been formed. In one or more embodiments, the first and second conductive interconnects may be formed substantially simultaneously. Hence, the first and second conductive interconnects may be formed such that there is at least some overlap time in the formation of the two conductive interconnects.

Referring to FIG. 16, the conductive interconnect 320 may comprise two portions. The first portion may be a conductive line 320A of a metallization level of, for example, a semiconductor chip. The metallization level may be a first metallization level of, for example, a semiconductor chip.

The second portion may be a conductive contact 320B. The conductive contact 320B may be electrically coupled between the first metallization level and the substrate 110. For example, the conductive contact 320B may be electrically coupled between the conductive line 320A of the first metallization level to the substrate 110. In one or more embodiments, the conductive contact 320B may electrically couple the first conductive line 320A to the substrate 110. The conductive interconnect 320 may be formed by a dual-damascene process.

As noted, in one or more embodiments, the first and second interconnect structures 310, 320 may be formed simultaneously. In one or more embodiments, the first conductive interconnect may be formed simultaneously with the first portion 320A and/or the second portion 320B of the second conductive interconnect 320.

In one or more embodiments, the formation of the first and second conductive interconnects may comprise one or more common processes such as, without limitation, a common etch process, a common deposition process, a common growth process, a common planarization process, a common CMP process, etc.

Figure 17:
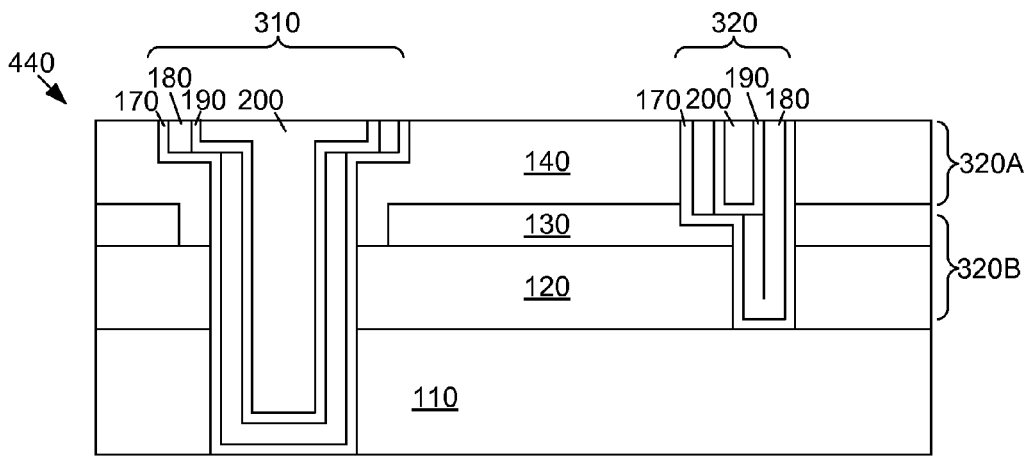

Referring to FIG. 17, the structure shown in FIG. 16 may be subjected to a backside grinding process and then, optionally, to a backside chemical mechanical polishing process to form the semiconductor structure 430 shown in FIG. 17 where the conductive interconnect 310 is exposed on the bottom side. In alternate embodiments, it is possible that the grinding and/or chemical mechanical polishing process may be continued to expose other portions of the conductive interconnect 310. In the embodiment shown in FIG. 17, the first barrier layer 170 may be exposed. In the embodiment shown in FIG. 17, the conductive interconnect 310 passes completely through the substrate. In the embodiment shown in FIG. 17, the conductive interconnect 310 forms an electrical pathway completely through the substrate 110 and may be referred to as a through-substrate via.

The semiconductor structure 430 shown in FIG. 16 may, for example, be a semiconductor chip. The semiconductor chip may include an integrated circuit. Likewise, the semiconductor structure 440 shown in FIG. 17 may, for example, be a semiconductor chip. The semiconductor chip may include an integrated circuit.

Referring to FIG. 17, it is noted that the embodiment of the conductive interconnect 310 shown is not electrically isolated from the substrate 310. In another embodiment of the invention is a conductive interconnect (such as a through-substrate via) that is electrically isolated from the substrate 310. For example, referring to FIG. 16, that, in another embodiment, the conductive interconnect include a dielectric layer that is disposed between the substrate 310 and the first barrier layer 170.

Figure 11A:
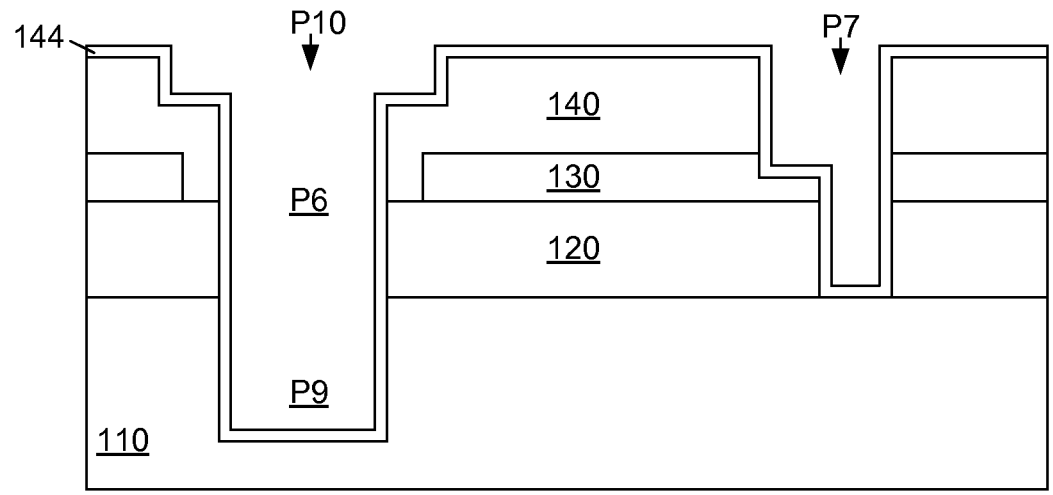
Figure 11B:
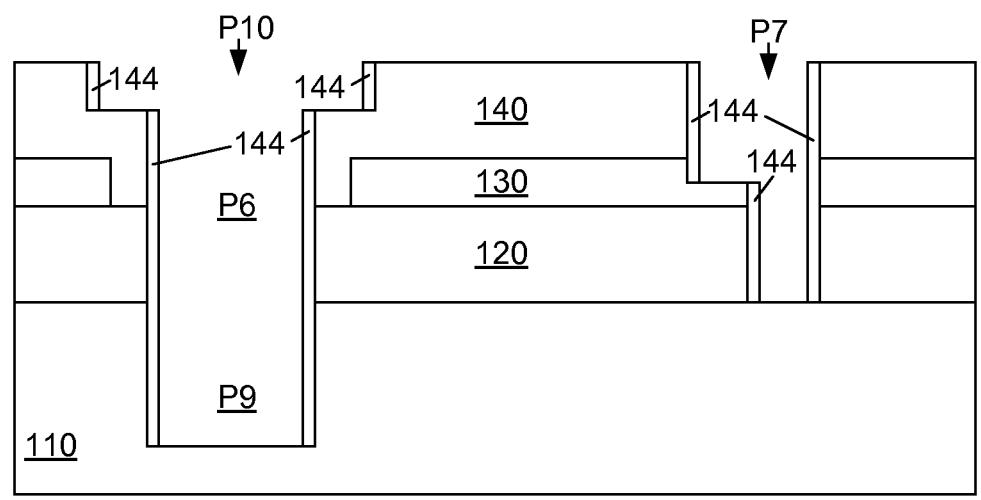

An electrically isolated conductive interconnect (such as a through-substrate via) may be formed in many different ways. Referring, for example, to FIG. 11A, it is seen that a dielectric layer 144 may be deposited over the structure shown in FIG. 10 to form the structure shown in FIG. 11A. The deposition may be a substantially conformal deposition. The dielectric layer 144 may be deposited within the opening P10 and, possible, also within the opening P7. Referring to FIG. 11B, the dielectric layer 144 in FIG. 11A may be etched to form the structure shown in FIG. 11B. In one or more embodiments, the etch may be a dry etch. In one or more embodiments, the etch may be a substantially anisotropic etch. The dielectric layer 144 may be used to electrically isolate the resulting conductive interconnect (for example, a through-silicon via) from the substrate 310.

The dielectric layer 144 may, for example, comprise at least one of an oxide, a nitride or oxynitride. The oxide may be, for example, thermal oxide, PECVD oxide, electrografted oxide. The nitride may be, for example, silicon nitride.

Other methods of making an isolated conductive interconnect that is isolated from the substrate are also possible.

In one or more embodiments, the formation of the conductive interconnects 310 and 320 shown in FIG. 16 or in FIG. 17 may comprise a triple damascene process.

The techniques described may provide certain advantages. For example, the techniques described may provide for complexity and cost reduction. In addition, it is possible that the methodology described above, may provide a way to through-silicon vias and/or conductive contacts having a larger range of lateral dimensions.

One or more embodiments may relate to a method for making a semiconductor structure, the method comprising: forming a first conductive interconnect at least partially through the substrate; and forming a second conductive interconnect over the substrate, wherein the first conductive interconnect and the second conductive interconnect are formed at least partially simultaneously.

One or more embodiments may relate to a method for making a semiconductor structure, comprising: providing a substrate; forming a dielectric layer over the substrate; forming a first opening in the dielectric layer and through at least a portion of the substrate; forming a second opening in the dielectric layer over the substrate, the second opening including an upper portion overlying lower portion; forming a first metallic material at least partially simultaneously within the first opening and the second opening; and forming a second metallic material over the first metallic material at least partially simultaneously within the first opening and the second opening.

One or more embodiments may relate to a method for making a semiconductor structure, comprising: providing a substrate; forming a dielectric layer over the substrate; forming a first opening and a second opening at least partially simultaneously through the dielectric layer over the substrate; and forming a third opening through the bottom surface of the first opening and into at least a portion of the substrate.

One or more embodiments may relate to a semiconductor structure, comprising: a semiconductor substrate; a dielectric layer overlying the substrate, the dielectric layer having a first opening, the first opening disposed through at least a portion of the substrate, the dielectric layer having a second opening laterally disposed from the first opening; a first metallic material substantially conformally disposed within the first opening and the second opening; and a second metallic material disposed over the first metallic material within the first opening and the second opening.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for making a semiconductor structure, the method comprising:
    forming a first conductive interconnect at least partially through said substrate; and
    forming a second conductive interconnect over said substrate, wherein said first conductive interconnect and said second conductive interconnect are formed at least partially simultaneously,
    said forming said first conductive interconnect and said forming said second conductive interconnect including:
        forming a first barrier layer;
        forming a first conductive layer over said first barrier layer, said first conductive layer including a first metallic material;
        forming a second barrier layer over said first conductive layer; and
        forming a second conductive layer over said second barrier layer, said second conductive layer including a second metallic material different from said first metallic material.

2. The method of claim 1, wherein said forming said first conductive interconnect and said forming said second conductive interconnect include at least one common process step.

3. The method of claim 2, wherein said at least one common process step includes a common etching step and/or a common deposition step.

4. The method of claim 1, wherein said first conductive interconnect is formed completely through said substrate.

5. The method of claim 1, wherein second conductive interconnect is laterally spaced from said first conductive interconnect.

6. The method of claim 1, wherein said second conductive interconnect comprises a conductive line in a first metallization level above said substrate and/or a conductive contact electrically coupled between said first metallization level and said substrate.

7. The method of claim 6, wherein said second conductive interconnect comprises said conductive line and said conductive contact, said conductive contact electrically coupled between said conductive line and said substrate.

8. The method of claim 1, wherein said forming said second conductive interconnect comprises a dual damascene process.

9. The method of claim 1, wherein said forming said second conductive interconnect comprises forming a second opening, said second opening comprising a lower portion for a conductive contact and an upper portion for a conductive line;
    wherein said forming said first barrier layer forming said first barrier layer in said lower portion and said upper portion, said forming said first conductive layer forms said first conductive layer in said lower portion and said upper portion, said forming said second barrier layer forms substantially all of said second barrier layer in said upper portion, said forming said second conducive layer forms substantially all of said second conductive layer in said upper portion.

10. The method of claim 9, wherein said first conductive layer substantially fills said lower portion.

11. The method of claim 1, wherein said first metallic material includes a first pure metal and/or a first metal alloy and said second metallic material includes a second pure metal and/or a second metal alloy.

12. The method of claim 1, wherein
    said forming said first conductive interconnect comprises
    forming a first opening at least partially through said substrate, said first barrier layer, said first conductive layer, said second barrier layer and said second conductive layer being formed in said first opening.

13. The method of claim 1, wherein said first conductive interconnect is electrically isolated from said substrate.

14. A method for making a semiconductor structure, comprising:
    providing a substrate;
    forming a dielectric layer over said substrate, wherein said dielectric layer comprises a first dielectric sublayer, a second dielectric sublayer over said first dielectric sublayer and third dielectric sublayer over said second dielectric sublayer, said first dielectric sublayer and said third dielectric sublayer comprising a common dielectric material, said second dielectric sublayer comprising a different dielectric material from said first and third dielectric sublayers;
    forming a first opening in said dielectric layer and through at least a portion of said substrate;
    forming a second opening in said dielectric layer over said substrate, said second opening including an upper portion overlying lower portion;
    forming a first metallic material at least partially simultaneously within said first opening and said second opening; and
    forming a second metallic material over said first metallic material at least partially simultaneously within said first opening and said second opening.

15. The method of claim 14, wherein said forming said first metallic material comprises depositing said first material within said first opening and said second opening using a common deposition step, and wherein forming said second metallic material comprises depositing said second material within said first opening and said second opening using a common deposition step.

16. The method of claim 14, wherein said upper portion is a trench, and said lower portion is a hole or a trench.

17. The method of claim 14, wherein said upper portion is wider than said lower portion.

18. The method of claim 14, wherein said first metallic material comprises a first pure metal and/or a first metal alloy.

19. The method of claim 14, wherein said second metallic material comprises a second pure metal and/or a second metal alloy.

20. The method of claim 14, wherein said first metallic material comprises a first pure metal and/or a first metal alloy, and said second metallic material comprises a second pure metal and/or a second metal alloy.

21. The method of claim 14, wherein said first metallic material is formed over a sidewall and bottom surface of said first opening and over a sidewall and bottom surface of said second opening.

22. The method of claim 14, wherein said forming said first metallic material comprises a substantially conformal deposition.

23. The method of claim 1, wherein said first metallic material includes pure tungsten and/or a tungsten alloy and said second metallic material includes pure copper and/or copper alloy.

* * * * *